(12) United States Patent
Akao et al.

(10) Patent No.: US 7,576,536 B2
(45) Date of Patent: *Aug. 18, 2009

(54) MRI METHOD AND APPARATUS FOR ADAPTIVE CHANNEL REDUCTION IN PARALLEL IMAGING

(75) Inventors: James Akao, Gainesville, FL (US); G. Randy Duensing, Gainesville, FL (US); Feng Huang, Gainesville, FL (US)

(73) Assignee: Invivo Corporation, Gainesville, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/430,384

(22) Filed: May 8, 2006

(65) Prior Publication Data

US 2007/0013375 A1    Jan. 18, 2007

Related U.S. Application Data

(60) Provisional application No. 60/678,559, filed on May 6, 2005.

(51) Int. Cl.
G01V 3/00    (2006.01)
(52) U.S. Cl. .................. 324/307; 324/309; 324/312
(58) Field of Classification Search ......... 324/300–322; 600/407–435
See application file for complete search history.

(56) References Cited

U.S. PATENT DOCUMENTS

| 3,210,736 | A | * | 10/1965 | Tashijian | 235/431 |
| 5,471,142 | A | | 11/1995 | Wang et al. | |
| 5,861,749 | A | | 1/1999 | Van Heelsbergen et al. | |
| 6,452,374 | B1 | | 9/2002 | Kreischer | |
| 6,522,140 | B2 | * | 2/2003 | Harvey | 324/318 |
| 6,597,173 | B1 | | 7/2003 | Bernstein | |
| 6,650,118 | B2 | * | 11/2003 | Leussler | 324/318 |
| 6,734,673 | B2 | * | 5/2004 | Agrikola | 324/318 |
| 6,771,067 | B2 | * | 8/2004 | Kellman et al. | 324/307 |
| 6,841,998 | B1 | * | 1/2005 | Griswold | 324/309 |
| 6,924,644 | B2 | * | 8/2005 | Suits et al. | 324/318 |
| 7,057,387 | B2 | * | 6/2006 | Duensing et al. | 324/307 |

(Continued)

FOREIGN PATENT DOCUMENTS

EP    1319957 A    6/2003

(Continued)

*Primary Examiner*—Brij B. Shrivastav
*Assistant Examiner*—Tiffany A Fetzner
(74) *Attorney, Agent, or Firm*—Saliwanchik, Lloyd & Saliwanchik

(57) ABSTRACT

The subject invention pertains to method and apparatus for parallel imaging. The subject method can be utilized with imaging systems utilizing parallel imaging techniques. In a specific embodiment, the subject invention can be used in magnetic resonance imaging (MRI). A specific embodiment of the subject invention can reduce parallel reconstruction CPU and system resources usage by reducing the number of channels employed in the parallel reconstruction from the M channel signals to a lower number of channel signals. In a specific embodiment, sensitivity map information can be used in the selection of the M channel signals to be used, and how the selected channel signals are to be combined, to create the output channel signals. In an embodiment, for a given set of radio-frequency (RF) elements, an optimal choice of reconstructed channel modes can be made using prior view information and/or sensitivity data for the given slice. The subject invention can utilize parallel imaging speed up in multiple directions.

17 Claims, 15 Drawing Sheets

U.S. PATENT DOCUMENTS

| | | | |
|---|---|---|---|
| 7,106,062 B1 * | 9/2006 | Hardy et al. | 324/318 |
| 7,141,971 B2 * | 11/2006 | Duensing et al. | 324/307 |
| 2002/0011843 A1 * | 1/2002 | Harvey | 324/307 |
| 2002/0125888 A1 | 9/2002 | Visser et al. | |
| 2002/0167315 A1 * | 11/2002 | Kellman et al. | 324/307 |
| 2003/0020475 A1 * | 1/2003 | Leussler | 324/318 |
| 2003/0038632 A1 * | 2/2003 | Duensing et al. | 324/307 |
| 2003/0069495 A1 * | 4/2003 | Agrikola | 600/410 |
| 2004/0193038 A1 * | 9/2004 | Reykowski et al. | 600/410 |
| 2005/0057251 A1 * | 3/2005 | Suits et al. | 324/318 |
| 2006/0055405 A1 * | 3/2006 | Duensing et al. | 324/307 |
| 2007/0013375 A1 * | 1/2007 | Akao et al. | 324/309 |
| 2007/0182411 A1 * | 8/2007 | Bammer et al. | 324/307 |
| 2008/0279433 A1 * | 11/2008 | Brau et al. | 382/131 |

FOREIGN PATENT DOCUMENTS

| | | |
|---|---|---|
| WO | WO 03/003037 A | 1/2003 |

* cited by examiner

MRI METHOD AND APPARATUS FOR ADAPTIVE CHANNEL REDUCTION IN PARALLEL IMAGING

CROSS-REFERENCE TO RELATED APPLICATION

The present application claims the benefit of U.S. Provisional Application Ser. No. 60/678,559, filed May 6, 2005, which is hereby incorporated by reference herein in its entirety, including any figures, tables, or drawings.

BACKGROUND OF INVENTION

With respect to parallel imaging in fields such as Magnetic Resonance Imaging (MRI), typical array reconstructions improve image signal-to-noise (SNR) by adding more radio-frequency (RF) array channels. In parallel imaging methods, however, the system load increases greater than linearly with the number of channels, where system load refers to the computations required to process the signals from the channels. It is often desirable to reduce the system load for faster reconstruction time or refresh rate, or to permit more complex reconstruction methods within existing system and user limits. Hardware requirements and software sophistication may also be reduced with fewer array channels.

The MRI Devices Corporation 8 channel Neuro-Vascular Array (NVA) employs a user-selectable channel compression from 13 to 8 channels. One configuration uses only 8 head elements. Another configuration uses 5 neck and chest elements along with 3 orthogonal modes from the 8 head elements. The MRI Devices Corporation NVA can be considered a selectable channel reduction that can be used for varying anatomical fields of view.

The Medrad Neuro-Vascular Array and the Gore Cardio-Vascular Array employ combiners to select the field of view provided by more elements than employed channels.

The Siemens TIM array selects modes from a 3-3 noise whitening EIGENCOIL combiner, depending on the parallel imaging factor desired.

Currently, on 32 channel systems, channel sub-selection is often used to reduce reconstruction load. Unfortunately, for a large field of view image, significant information can be lost when the channels are turned off to reduce reconstruction load.

Parallel reconstruction with 32 channels is currently too time consuming for 3D data sets to be easily performed on MR scanners. Further increases in scanner computation power may eventually obviate the need for channel compression. In the meantime, dynamic compression provides good results. Dynamic compression can also carry a low application risk, because it simulates a coil with fewer channels rather than fundamentally changing the reconstruction path.

BRIEF DESCRIPTION OF DRAWINGS

FIG. 1A shows a view with a mainly SI PE direction for coronary artery visualization, FIG. 1B shows an image slice with 4 to 1 wrap regions in the SI direction and region of interest (ROI), FIG. 1C shows a view with a mainly LR PE direction for short axis visualization function, and FIG. 1D shows an image slice with 4 to 1 wrap regions in the LR and ROI.

FIG. 2A shows mode support of 8 SI oriented channels, FIG. 2B shows B1 sensitivity maps of 8 SI channels on a coronary slice, FIG. 2C shows B1 sensitivity maps of 8 SI channels on a short axis slice, FIG. 2D shows mode support of 8 LR oriented channels, FIG. 2E shows B1 sensitivity maps of 8 LR channels on a coronary slice, and FIG. 2F shows B1 sensitivity maps of 8 LR channels on a short axis slice.

FIG. 3A shows the SNR for the SI phase encode direction and the SNR for the LR phase encode, FIG. 3B illustrates 8 channels in a SI configuration and the corresponding SNR for the SI phase encoded direction and the SNR for the LR phase encode direction, FIG. 3C illustrates 8 channels in a LR configuration, and the corresponding SNR in the SI phase encoded direction and the SNR for the LR phase encode direction, FIG. 3D illustrates 32 independent channels and the corresponding SNR for the SI phase encode direction and the SNR for the LR phase encode direction.

FIG. 6A is the SNR sum of squares of 8 channel data with full k-space data and FIG. 6B is the SNR sum of squares of 4 combined channel data with half k-space data.

DETAILED DISCLOSURE OF THE INVENTION

The subject invention pertains to method and apparatus for parallel imaging. The subject method can be utilized with imaging systems utilizing parallel imaging techniques. In a specific embodiment, the subject invention can be used in magnetic resonance imaging (MRI). A specific embodiment of the subject invention can reduce parallel reconstruction CPU and system resources usage by reducing the number of channels employed in the parallel reconstruction from the M channel signals to a lower number of channel signals. In a specific embodiment, sensitivity map information can be used in the selection of the M channel signals to be used, and how the selected channel signals are to be combined, to create the output channel signals. In an embodiment, for a given set of radio-frequency (RF) elements, an optimal choice of reconstructed channel modes can be made using prior view information and/or sensitivity data for the given slice. The subject invention can utilize parallel imaging speed up in multiple directions.

An MRI system can utilize a number of RF coil elements as receivers, where each coil can produce a receive signal. The receive signals from single RF coil elements can be used to produce a channel signal and/or the signals from more than one RF coil element can be combined to produce a channel signal, such that one or more channel signals can be produced. For example, L RF coil elements can produce L RF coil element, or receive, signals, and the L RF coil element signals can be used to produce M channel signals, where each of the M channel signals is a complex linear combination of one or more of the L RF coil element signals. Each of the M channel signals can have sensitivity characteristics, $e_1$ (x, y, z), $e_2$ (x, y, z), ..., $e_M$(x, y, z), as a function of x, y, and z, over a region of interest. From the M channel signals, a plurality of mode sets can be provided where each mode set includes $N_i$ output channel signals, each output channel signal being a complex linear combination of one or more of the M channel signals.

Figure 10:
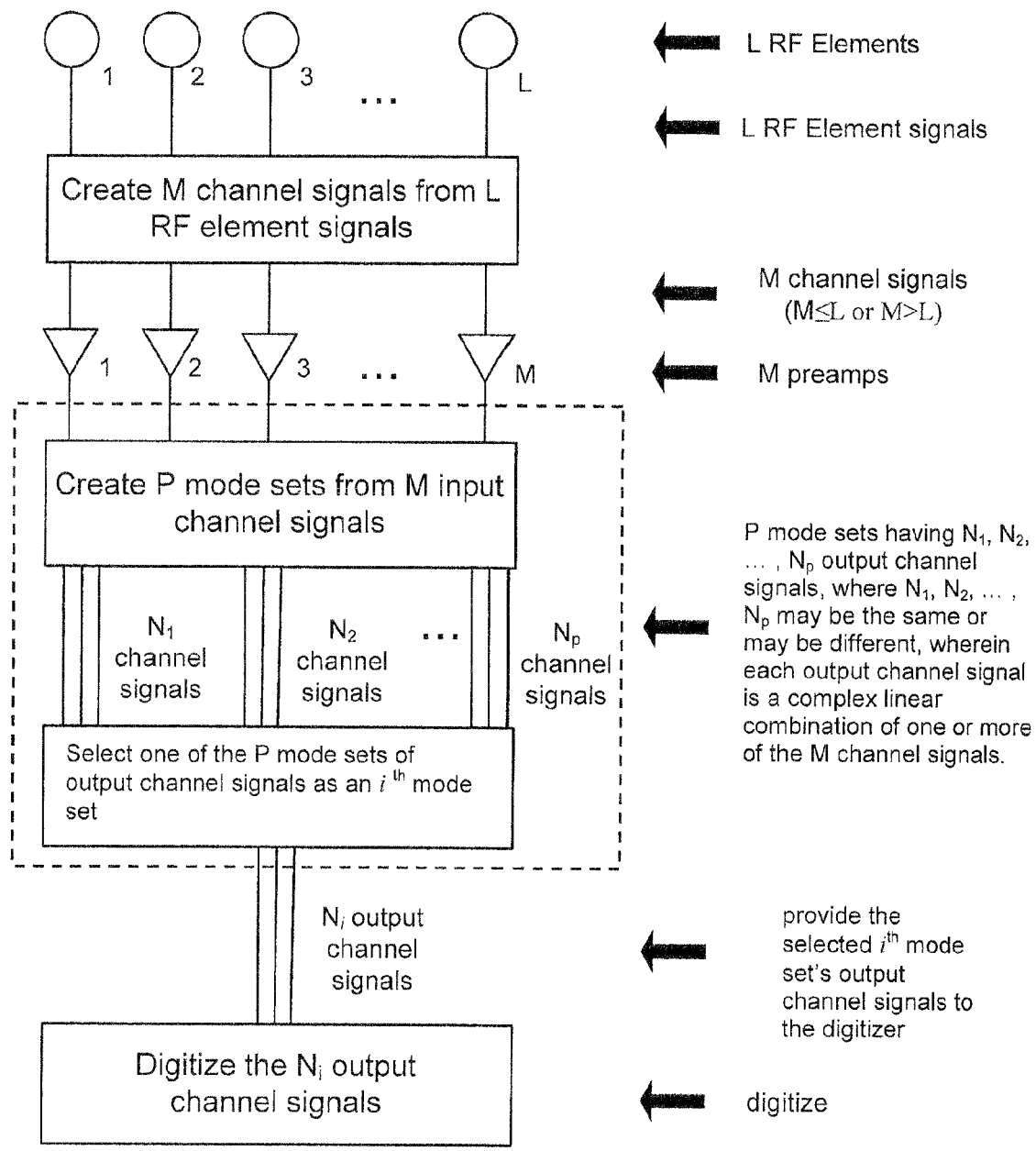
FIG. 10 shows a flow diagram for a hardware implementation of a mode selection technique in accordance with a specific embodiment of the subject invention.

The subject invention can allow selection among a plurality of mode sets, where each mode set includes one or more output channel signals, where each output channel signal is a complex linear combination of one or more of M channel signals. Each of the channel signals is a complex linear combination of one or more of the L RF coil element signals. FIG. 10 shows a diagram of a specific embodiment of the subject invention. In a specific embodiment, the number of output channel signals in each of the P mode sets is $N_1, N_2, \ldots, N_p$, respectively. In an embodiment, $N_1, N_2, \ldots, N_p$ are each less than or equal to M. In an alternative embodiment, one or more of $N_1$, N2 ..., $N_p$ can be greater than M for, for example, sub-selection or a late-stage of processing. In such an embodiment, for example, the output channel signals created can provide various regions of coverage, sensitivity properties, and/or other properties relevant to the application. In an embodiment, the subject method can use a mode set selection to select between a plurality of P mode sets in such a way to reduce the number of synthetic, or output, channels used in the most resource intensive phase of parallel reconstruction. In GRAPPA, the calibration and application of weights to fill in missing k-space data is resource intensive. In SENSE, the solution of linear systems to unwrap a folded image is resource intensive. Other parallel imaging methods have a similar character: each point requires interacting information from many, or all, channels.

In a specific embodiment, P mode sets is P signal combinations of the original M input channel signal basis. The output of the M to $N_i$ combiner is a set of $N_i$ synthetic, or output, channels, where the $i^{th}$ mode set is selected. A particular choice of mode set is represented mathematically by the complex entries of an $N_i$ by M matrix, Q. The production of the N synthetic channels can be accomplished either by a hardware combiner circuit or can be accomplished via software. In an embodiment, a hardware circuit operates on the analog RF signals. In another embodiment, software can be utilized to perform matrix multiplication on the digitized readouts.

The choice of a mode set is not unique. The P mode sets can include a mode set with, for example, M orthogonal mode directions from M channels and a mode set with a subset of those modes. Varying the mode directions and mode subsets can influence the signal-to-noise ratio (SNR) of the reconstructed image. While details of parallel and full k-space reconstruction algorithms vary, the quality of mode selections can be broadly characterized. In the same way that the concept of G-factor is applicable to most parallel imaging algorithms, the SNR ratio between reconstruction of the original M channel signals and reconstruction of the $N_i$ synthetic, or output, channel signals is not strongly influenced by algorithm choice. The SNR depends strongly on the image placement relative to the RF elements, the parallel imaging acceleration factor, and the phase encoding acceleration direction, in addition to the mode selection, Q.

In a specific embodiment, utilizing hardware employing multiple combiner circuits with distinct mode outputs, a means of switching between circuits can be employed. In an embodiment, the switch decision can be made based on the direction of phase encoding during parallel imaging.

In another specific embodiment, utilizing software, prior information about the RF element layout can be stored and mode selections can be pre-computed. In an embodiment, switching between mode selections can be based on the direction of phase encoding during parallel imaging.

In another specific embodiment utilizing software, information about the RF sensitivity profile can be obtained from full M channel data. Then, using, for example, Singular Value Decomposition (SVD) or Principle Component Analysis (PCA), P mode sets for the particular image can be determined. The M to N combiner can be applied using $N_i$ channels in the parallel reconstruction algorithm, where the $i^{th}$ mode set is selected.

A mathematical optimization can be used to determine the mode set selection in accordance with the subject invention.

Selectable Mode Compression

Most system coil interfaces include logic control lines that can be employed to reconfigure the coil. The MRI Devices Corporation Neuro-Vascular Array (NVA) uses an RF switch to route amplified MR receive signals either through a hardware combiner circuit or directly to system channels. The resulting modes, each having 8 system channels, have different B1 sensitivity profiles, covering, for example, the head only or the head, neck, and chest.

In a specific embodiment of the subject invention, the decision to reconfigure the coil is made on the basis of the phase encode direction, as well as the desired field of view.

The hardware combiners can use the same input RF element signals and select different modes, to produce B1 sensitivity profiles with significant variation in the phase encode direction. Variation of channel sensitivity profiles in the accelerated phase-encode (PE) direction can reduce g-factor and/or improve parallel imaging SNR.

FIGS. 1A-1D show two example views used for parallel imaging. In the coronary image shown in FIG. 1B, taken with the configuration shown in FIG. 1A, the phase encode direction is top to bottom, mainly the superior-inferior (SI) direction along the z-axis. Points from each of the 4 horizontal sections are wrapped onto each other and acquired at once. The fold lines can be seen in FIG. 1B and are positioned at ¼ of the distance from the top, the middle, and ¼ of the distance from the bottom of the image. In the short axis image shown in FIG. 1D taken with the configuration shown in FIG. 1C, the phase encode direction is left to right, mainly the left-right (LR) direction along the x-axis. Points from each of the 4 vertical sections are wrapped onto each other during parallel image acquistion. The fold lines can be seen in FIG. 1D and are positioned ¼ of the distance from the left, in the middle, and ¼ of the distance from the right.

Coil sensitivity profiles can be used to unwrap the image. Corresponding wrapped points preferably have distinct sensitivity profiles, in order to have a low G-factor and good parallel SNR.

Figure 2A:
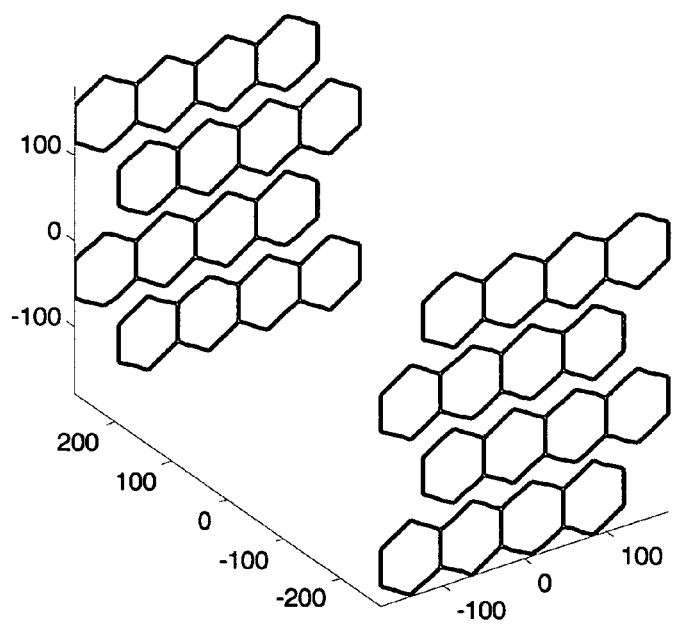
FIGS. 2A-2F show two combiner mode selections with B1 sensitivity maps, where
Figure 2B:
Figure 2C:
Figure 2D:
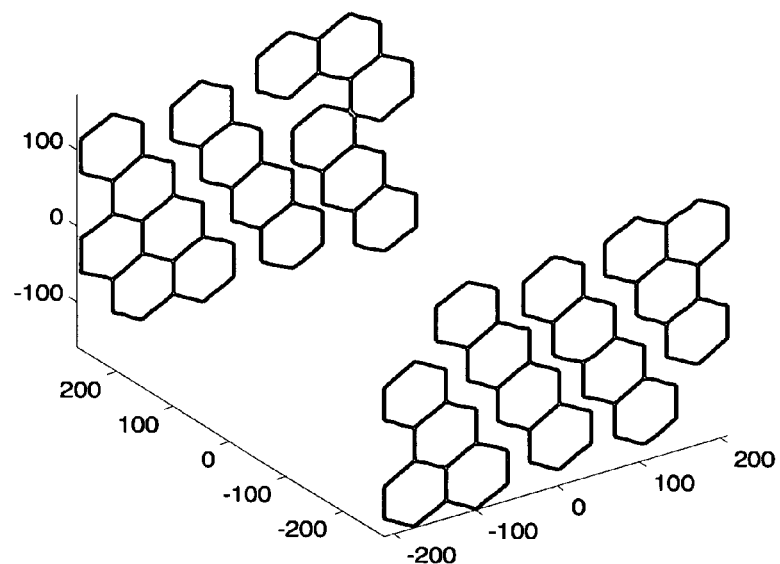
Figure 2E:
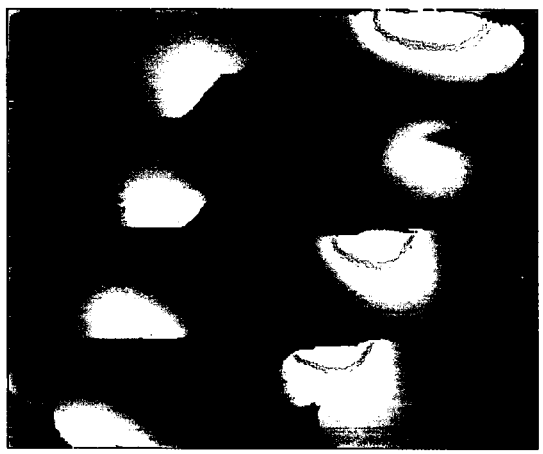
Figure 2F:
Figure 3A:
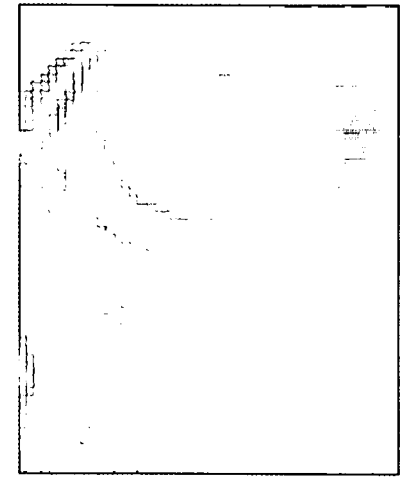
FIGS. 3A-3D illustrate parallel imaging signal-to-noise ratios (SNR) of coil configurations, where
Figure 3A:
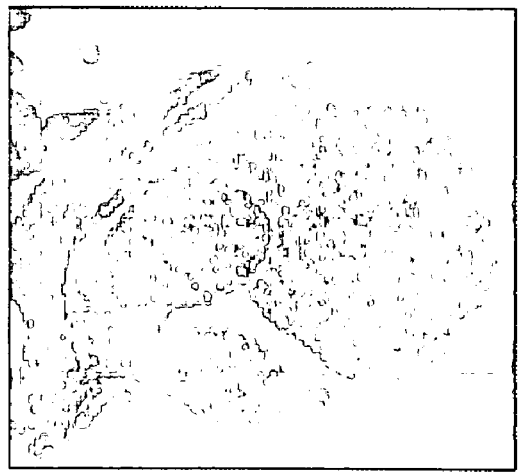
Figure 3B:
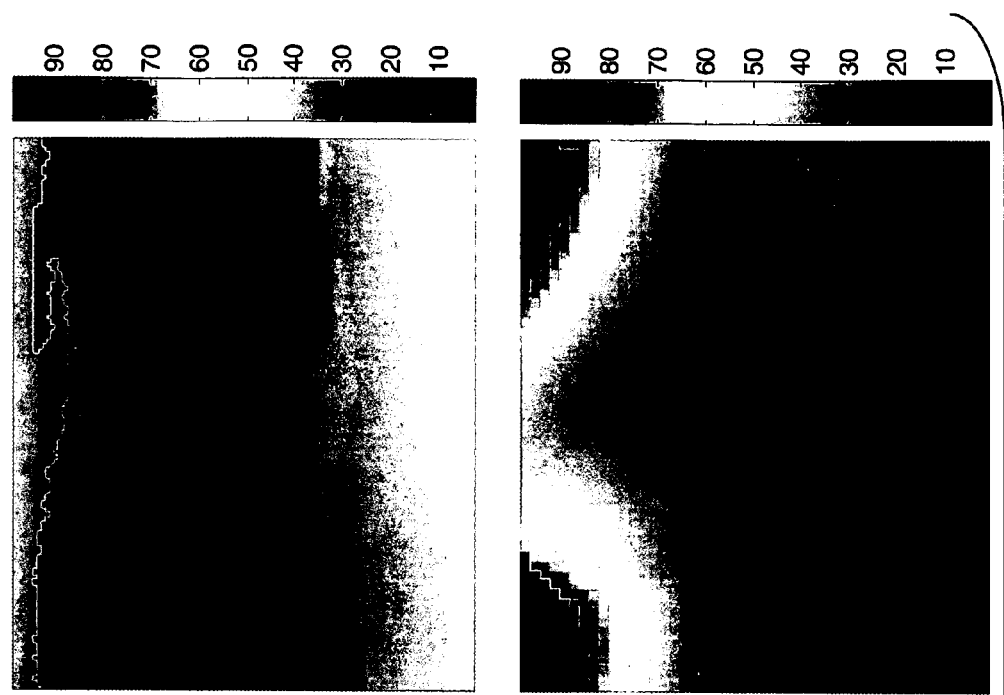
Figure 3B:
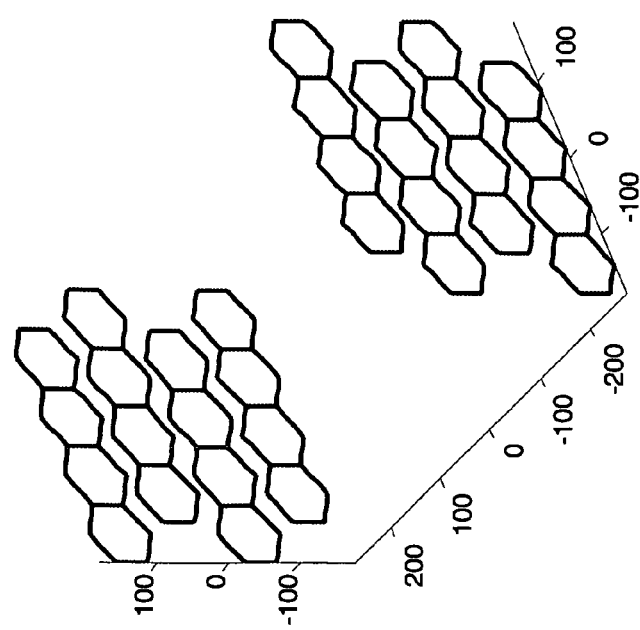
Figure 3C:
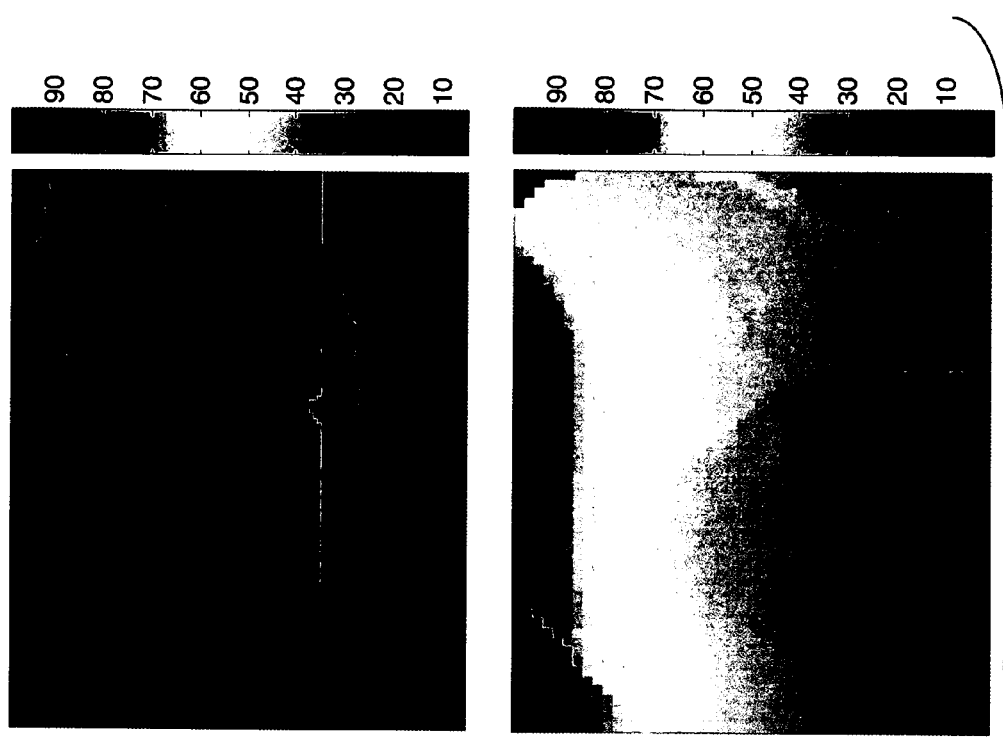
Figure 3C:
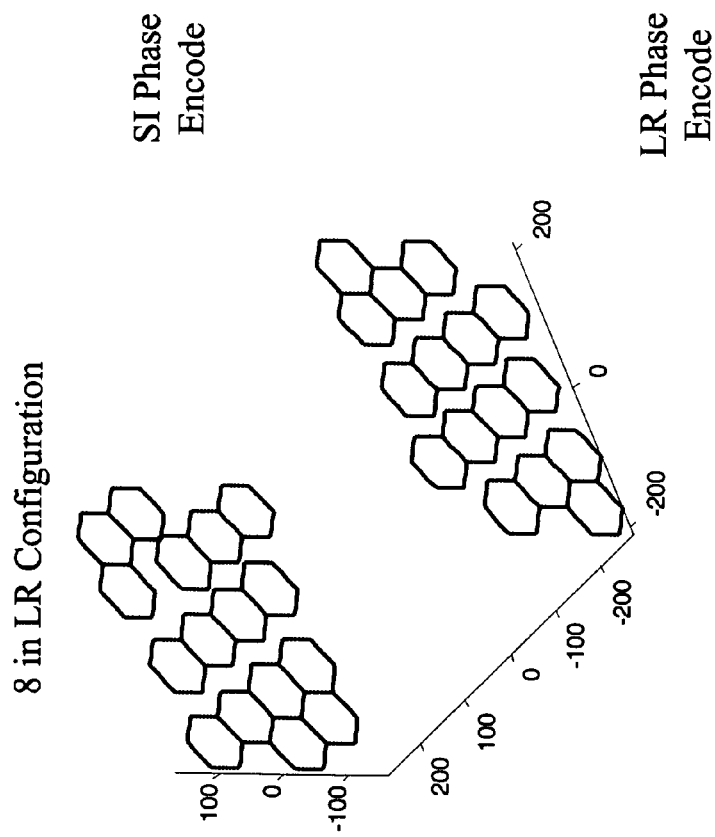
Figure 3D:
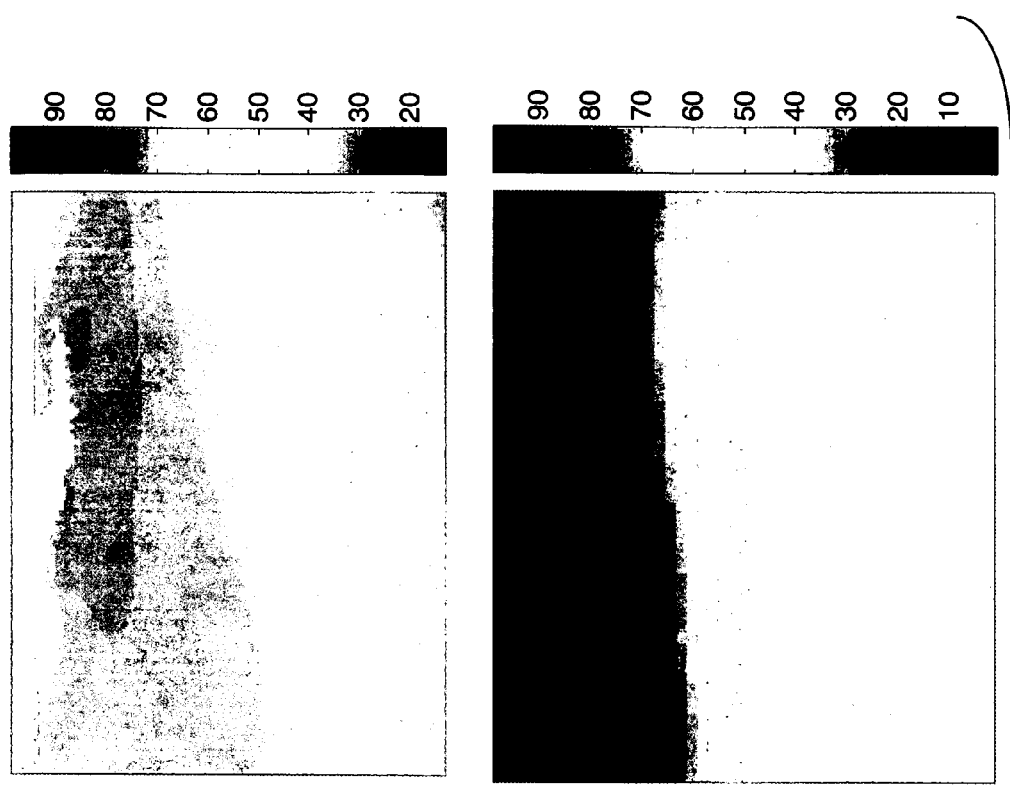
Figure 3D:
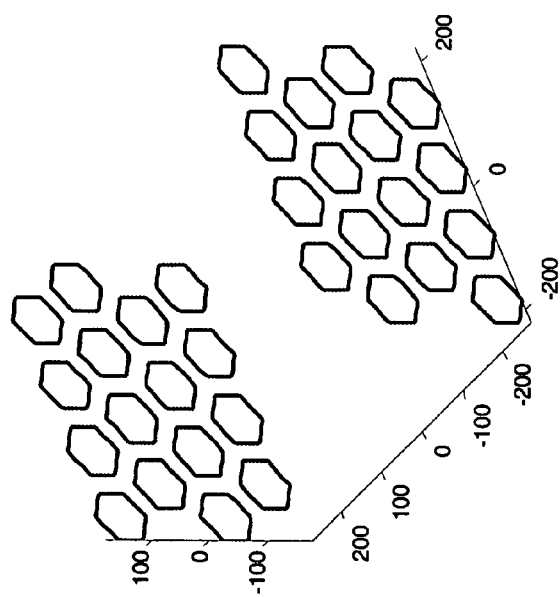

FIGS. 2A-2F show two examples of combiner mode choices. FIG. 2A shows a configuration where clusters of 4 coils each are created and FIG. 2D shows a configuration where clusters of 4 or 5 coils each are created. In these examples, information from each cluster of elements is compressed into a single channel. Compared to the 32 channel coil, variation from different elements of a cluster is thus lost. Variation from different clusters, however, is retained.

Figure 1A:
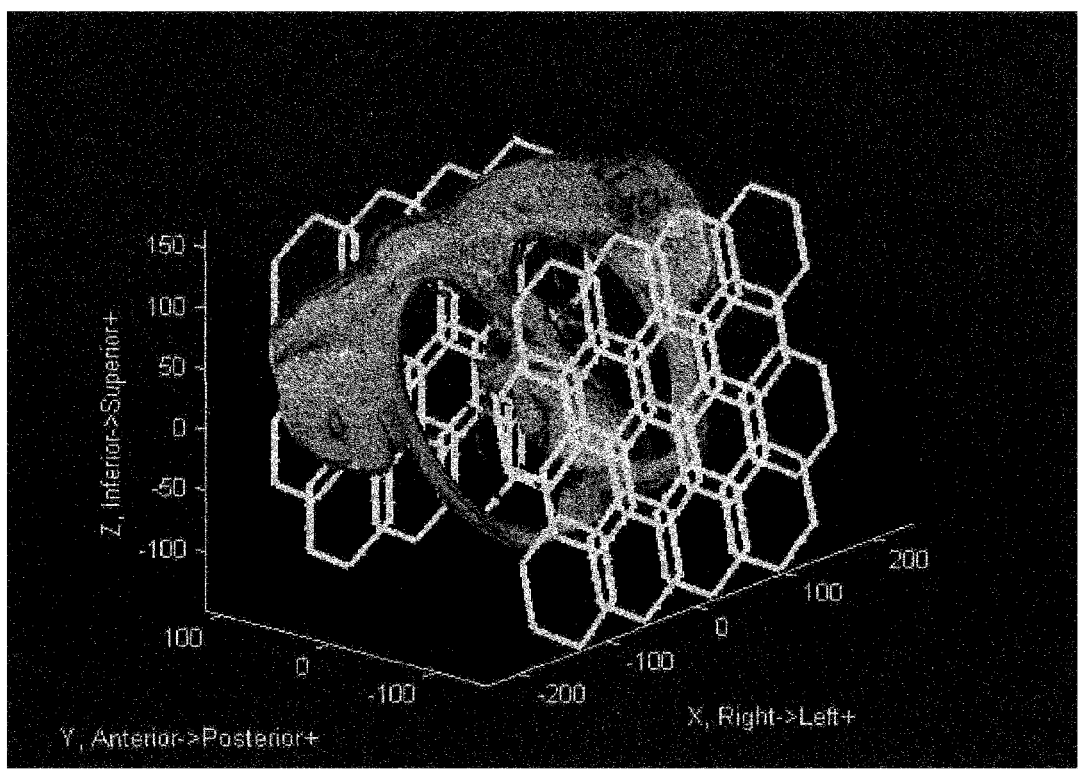
FIGS. 1A-1D show views with superior-inferior (SI) and left-right (LR) phase encode (PE) directions for parallel imaging, where
Figure 1B:
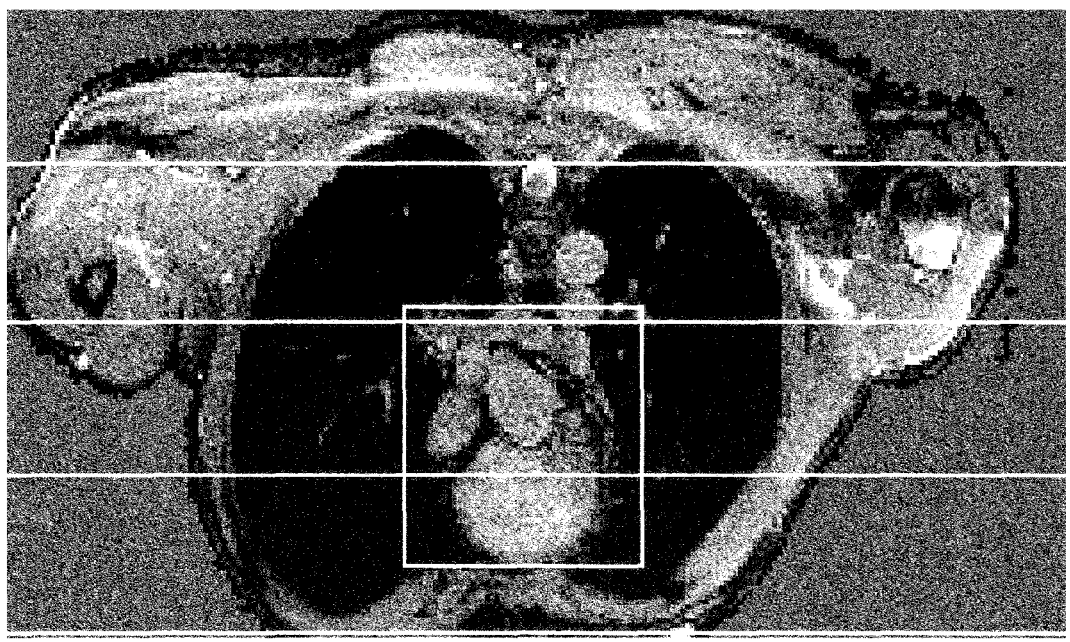
Figure 1C:
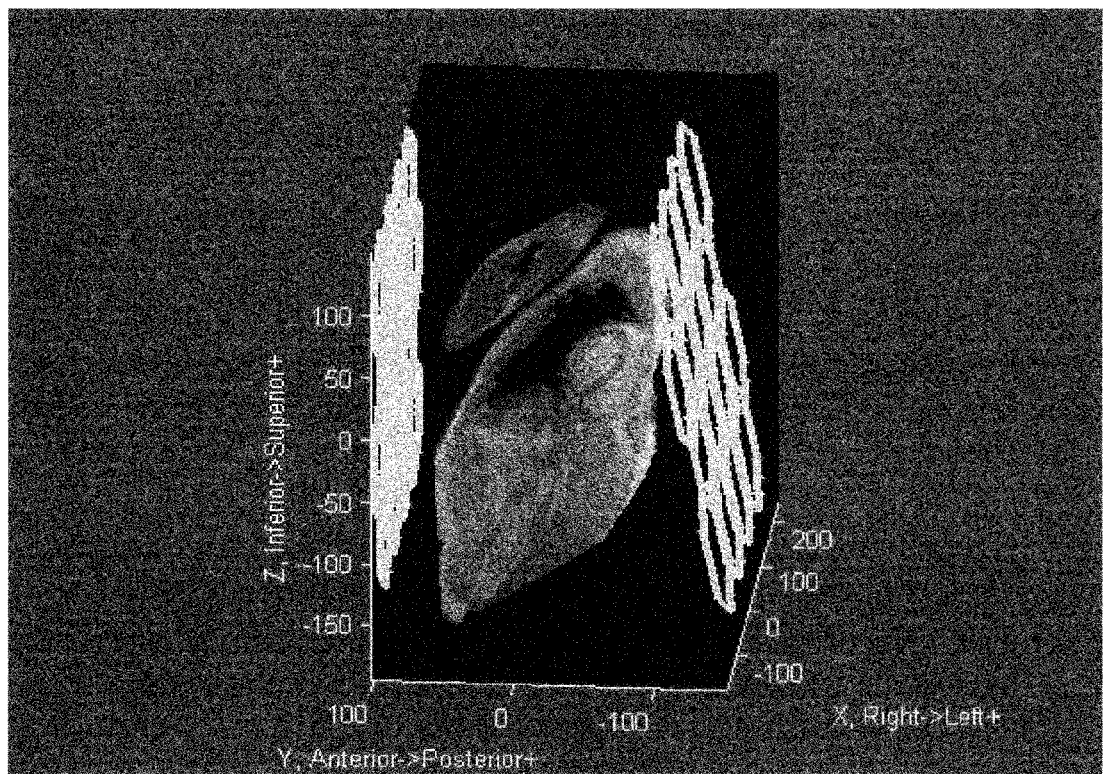
Figure 1D:
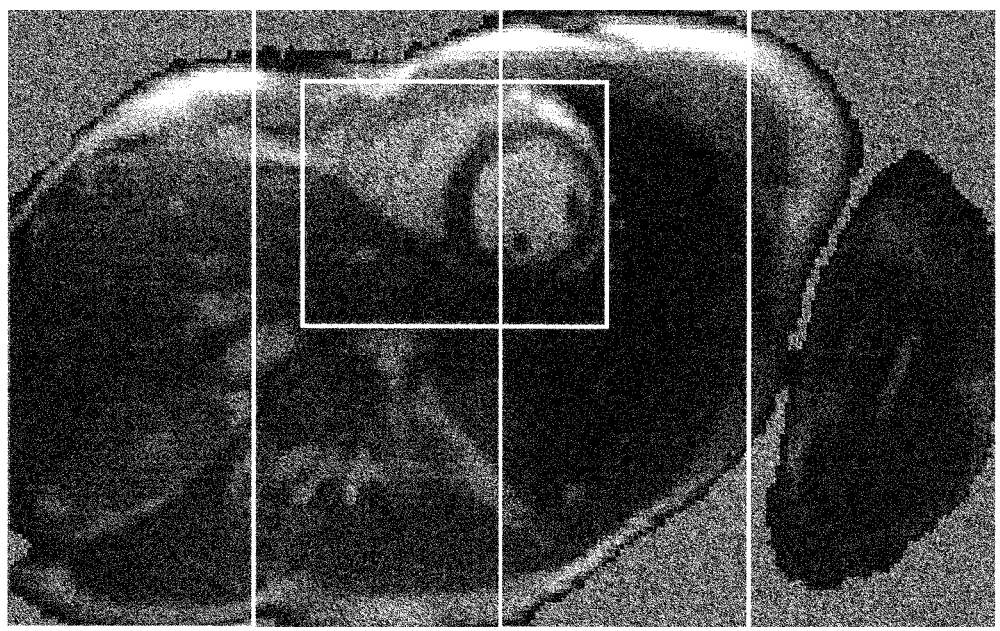

FIGS. 3A-3D show the SNR performance for the different slice/PE (phase encode) selections for the coil configuration shown in FIGS. 1A and 1C and the different mode choices in FIGS. 2A and 2D. The SNR of the full 32 channel coil is also shown, as a reference. At high speedup rates (×4), SNR is lost by compressing from 32 to 8 channels. However, proper selection of combiner type can allow enhancement of the 8 channel performance. In an embodiment, a view with a primarily SI phase encoding direction can use the configuration shown in FIG. 3B and a view with a primarily LR phase encoding direction can use the configuration shown in FIG.

3C, such that enhanced 8 channel performance is achieved when imaging with SI phase encoding and LR phase encoding.

Table 1 Summarizes the Combiner Performance.

TABLE 1

Mean Parallel SNR in Region of Interest

|  | SI Phase Encode | LR Phase Encode |
| --- | --- | --- |
| 8 in SI Configuration | 34.8 (best 8 ch) | 32.0 |
| 8 in LR Configuration | 15.9 | 46 (best 8 ch) |
| 32 Independent Channels | 45.8 | 72.4 |

Sensitivity Based Mode Compression

Selectable hardware combiners can use prior assumptions about the B1 sensitivity map profiles to determine a good set of combiner modes, or mode sets, for the given scan. The accuracy of the sensitivity determination is limited by the repeatability of coil positioning. The adaptivity of the combiners is limited by a fixed number of combiner circuits utilized in the coil, and by limitations on the combiner circuit complexity.

On a system capable of digitizing many RF channels, mode compression can be implemented via software with respect to the digital signals. This is noted in U.S. published patent application No. US 2003/0038632 A1, which is incorporated herein by reference in its entirety.

In an embodiment utilizing software, the mode matrix can be selected from a pre-determined set. In a further embodiment, an estimate of the M-channel sensitivity map can be obtained from, for example, a prescan or from a few phase encode lines. When the map is low resolution, the map estimate requires much less processing than the full M-channel parallel reconstruction.

In an embodiment of the subject invention, combiner modes can be determined from the sensitivity map, providing a way to tailor the combiner modes to each scan. The sensitivity map sampling matrices, S, can be sampled. Each sampling matrix is M×NWrap, where NWrap is the number of points wrapped onto each other by the phase encode undersampling and M is the number of channels. A different matrix S exists for each point of the sampled wrapped image.

In a region of interest, the matrices S vary from point to point. If the variation is small, a combiner can be determined as follows from an example matrix S:

1. Let $U*Sigma*V^H = S$ be the singular value decomposition of S, where U and V are complex orthogonal matrices, sigma is a real diagonal matrix, and * represents matrix multiplication, and $V^H$ is the Hermitian transpose of V.
2. To compress to N channels, take as modes the first N columns of U, corresponding to the largest singular values of S. Note that only the first NWrap modes contribute to the reconstruction; the later singular values are 0. A SENSE reconstruction will not benefit from additional modes after the first NWrap modes.

Since the sensitivity matrices vary from point to point, more than NWrap channels can be used, exploiting the freedom of the larger space to obtain a set of modes that are good for all the points in the region of interest.

In an embodiment, a general optimization process can find a complex matrix, Q, having M orthogonal rows N long, such that the energy in the column vectors of Q*S is maximized when summed over all the sensitivity matrices S in the region of interest. Such a process may be fairly complex.

In another embodiment, a simpler method can be implemented. If there are NPts sensitivity matrices, the NPts sensitivity matrices can be packed together in a matrix A which is M by NWrap*NPts. The first M singular vectors of A can then be derived by forming $A^H*A$ (M by M) and using eigen decomposition, wherein $A^H$ is the conjugate row-column transpose of A. [REF Applied Numerical Linear Algebra, J. Demmel, SIAM, 0-89871-389-7]. Alternatively, the Principal Components Algorithm (PCA) can be used to form the M by M cross correlation rather than the matrix square.

If localization to a region of interest is not required, the singular vector decomposition (SVD) or PCA methods can be applied in k-space to the FFT of the sensitivity map, or even to the low resolution FFT of the image. This can allow the combiner to be determined directly from the auto-calibration signal (ACS) readout lines of a GRAPPA scan.

If a precomputed or measured estimate of the M noise covariance is available, algorithm performance can be somewhat improved by using a further EIGENCOMBINER™ to whiten the noise in the M output channels.

In a specific embodiment of the subject invention, a software module can be used to perform dynamic channel compression. Such a module can be included with, for example, a 32 channel cardiac coil. Slighty modified sequences can be delivered that call the module, current sequences can be recompiled.

A specific embodiment of a cardiac coil can include at least one combiner mode selection for 18/16 channels. In another embodiment, an 8 channel coil, for example used in installed base systems, can incorporate multiple combiners and can offer significant advantages over existing 8 channel coils.

Algebra Based Combination

Algebra based combination can be used to reduce the number of receiving channels. The goal is to compress data. SVD (singular value decomposition) or PCA (principal component analysis) are tools for data compression. These tools can be applied to reduce the number of receiving channels. Since the Fourier transform is orthonormal inner products in K-space will be the same in image space. As it is easier to process the image in image space, it may be preferable to generate the combination matrix in image space instead of K-space.

Let $I_j$ be the image from the $j^{th}$ channel, j=1, 2, ..., M. Each image can be reshaped to be a vector and then SVD or PCA can be applied to analysis those vectors. In a case having m points in each image, a matrix T with size m×M can be formed. In an embodiment, the number of channels can be reduced to be k, where k <M.

An example of the use of SVD in accordance with an embodiment of the subject invention is provided below:

1. Decompose matrix T to be $U*S*V^H = T$, where U is a orthonormal matrix with size m×m, S is a pseudo-diagonal matrix with size m×n, and V is a orthonormal matrix with size n×n;
2. Find the biggest k entries in S, and find the corresponding vectors in V to form a n×k matrix $Q^H$;
3. Q is the combination matrix to combine K-space data An example of the use of PCA in accordance with an embodiment of the subject invention is provided below:

1. Each column of T subtracts the mean of this column and generates a new matrix T1.
2. Calculate the covariance CV matrix of the columns of T1.
3. Calculate the eigenvalues L and eigenvectors V of CV
4. Find the biggest k eigenvalues in L, and find the corresponding vectors in V to form a n×k matrix $Q^H$;
5. Q is the combination matrix to combine K-space data In the case where low-resolution images are available for sensitivity maps, the low-resolution images, or the corresponding sensitivity maps, can be used to produce T for the combination matrix.

Experiment

Figure 6A:
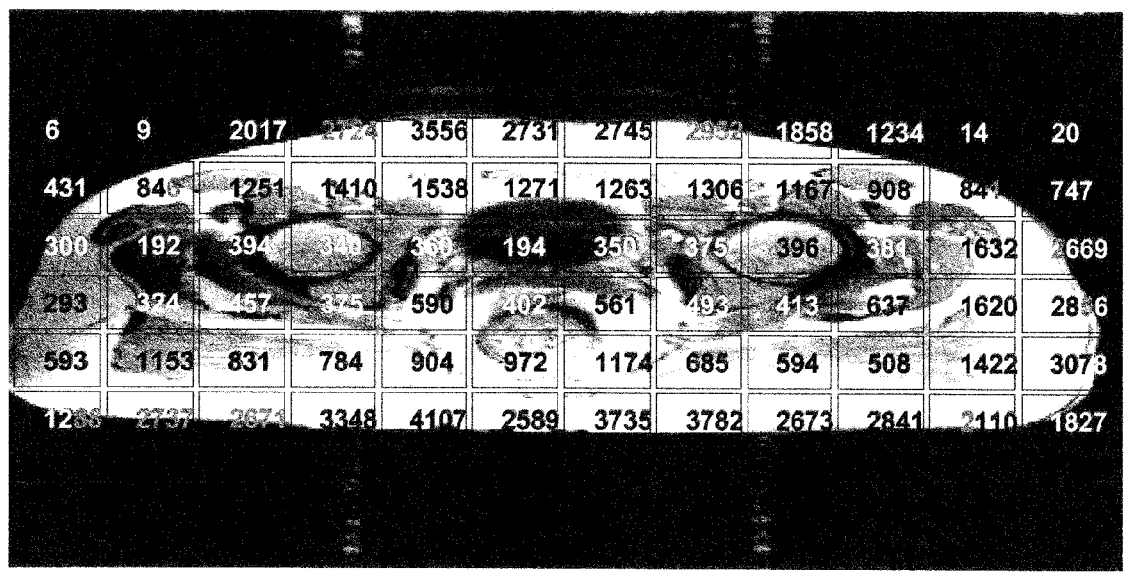
FIGS. 6A and 6B show the SNR sum of squares, where
Figure 6B:
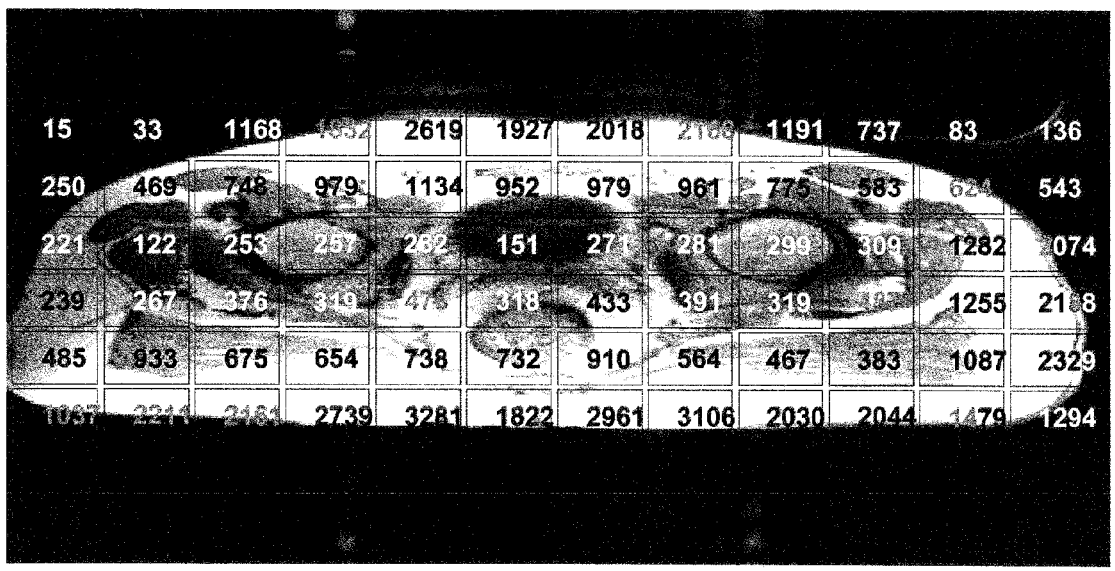
Figure 7A:
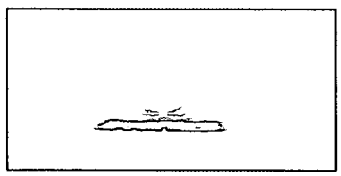
FIGS. 7A-7H show the sensitivity maps for the original 8 channels in a specific coil array.
Figure 7B:
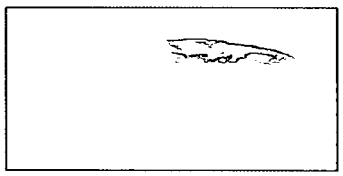
Figure 7C:
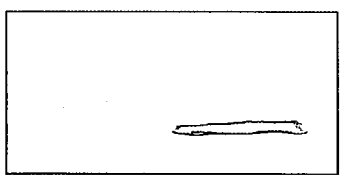
Figure 7D:
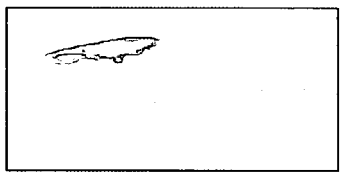
Figure 7E:
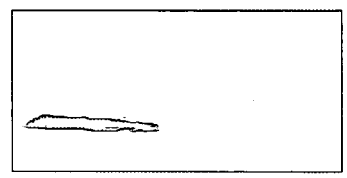
Figure 7F:
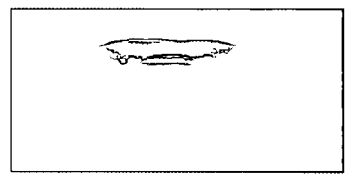
Figure 7G:
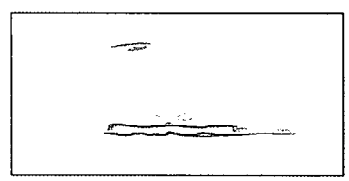
Figure 7H:
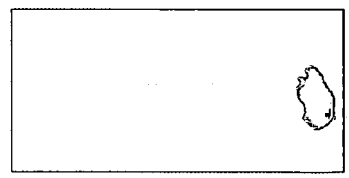
Figure 8A:
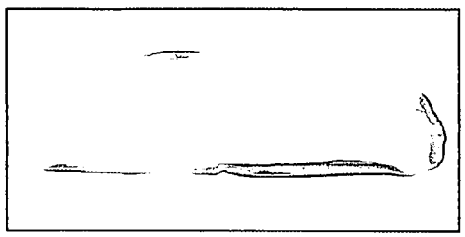
FIGS. 8A-8D show combined 4 channels by combination matrix generated by principal component analysis (PCA) with low resolution sensitivity maps in accordance with a specific embodiment of the subject application.
Figure 8B:
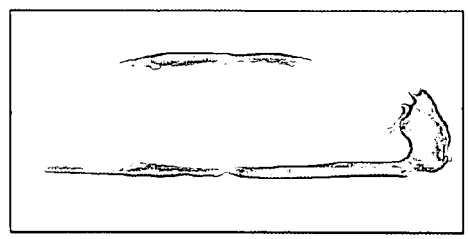
Figure 8C:
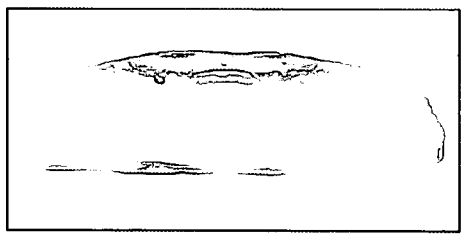
Figure 8D:
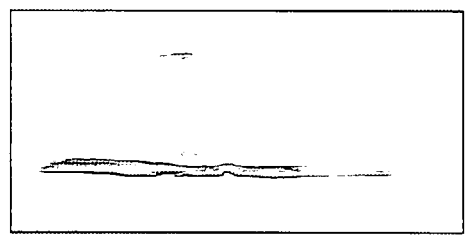
Figure 9A:
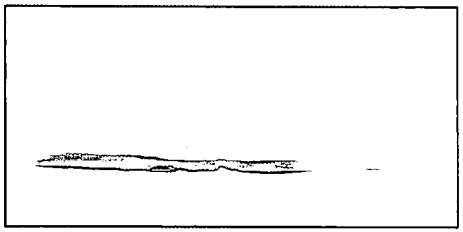
FIGS. 9A-9D show combined 4 channels by combination matrix generated by singular value decomposition (SVD) with low resolution sensitivity maps in accordance with a specific embodiment of the subject application.
Figure 9B:
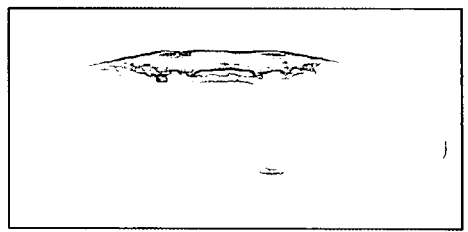
Figure 9C:
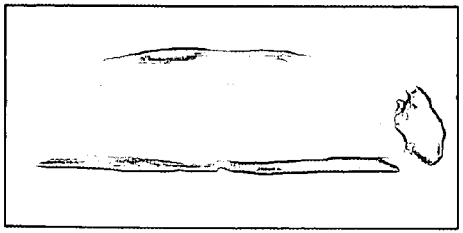
Figure 9D:
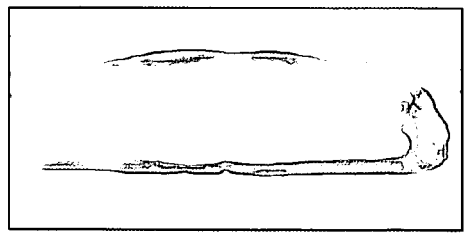

In this experiment, data collected with an 8-channel system is used. The image size is 256×512. Sliding GRAPPA is applied to reconstruct the images. The reduce-factor is 2 and 15 extra automated calibration signal (ACS) lines are used. The low-resolution images and low-resolution sensitivity maps are generated with the ACS lines. The 8 channels are reduced to 4 channels. For comparison, the true image and high-resolution sensitivity maps are also used. Table 2 shows the time to produce the combination matrix, the time for reconstruction, and the relative error for a variety of techniques. FIGS. 6A and 6B shows the SNR of sum of squares of 8 combined channel data with full K-space and the SNR of sum of squares of 4 combined channel data with half K-space, respectively. Chart 1 and Chart 2 show the SNR of sum of squares from FIG. 6A and FIG. 6B, respectively.

CHART 1

(SNR of sum of squares from FIG. 6A)

| 6 | 9 | 2017 | 2724 | 3556 | 2731 | 2745 | 2952 | 1858 | 1234 | 14 | 20 |
|---|---|---|---|---|---|---|---|---|---|---|---|
| 431 | 846 | 1251 | 1410 | 1538 | 1271 | 1263 | 1306 | 1167 | 908 | 841 | 747 |
| 300 | 192 | 394 | 340 | 360 | 194 | 350 | 375 | 396 | 381 | 1632 | 2669 |
| 293 | 324 | 457 | 375 | 590 | 402 | 561 | 493 | 413 | 637 | 1620 | 2856 |
| 593 | 1153 | 831 | 784 | 904 | 972 | 1174 | 685 | 594 | 508 | 1422 | 3078 |
| 1288 | 2737 | 2671 | 3348 | 4107 | 2589 | 3735 | 3782 | 2673 | 2841 | 2110 | 1827 |

CHART 2

(SNR of sum of squares from FIG. 6B)

| 15 | 33 | 1168 | 1832 | 2619 | 1927 | 2018 | 2168 | 1191 | 737 | 83 | 136 |
|---|---|---|---|---|---|---|---|---|---|---|---|
| 250 | 469 | 748 | 979 | 1134 | 952 | 979 | 961 | 775 | 583 | 624 | 543 |
| 221 | 122 | 253 | 257 | 282 | 151 | 271 | 281 | 299 | 309 | 1282 | 2074 |
| 239 | 267 | 376 | 319 | 478 | 318 | 433 | 391 | 319 | 487 | 1255 | 2188 |
| 485 | 933 | 675 | 654 | 738 | 732 | 910 | 564 | 467 | 383 | 1087 | 2329 |
| 1037 | 2211 | 2161 | 2739 | 3281 | 1822 | 2961 | 3106 | 2030 | 2044 | 1479 | 1294 |

FIGS. 7A-7H show the sensitivity map, for the original 8 channels in a specific coil array. FIGS. 8A-8D show combined 4 channels by combination matrix generated by PCA with low resolution sensitivity maps. FIGS. 9A-9D show combined 4 channels by combination matrix generated by singular value decomposition (SVD) with low resolution sensitivity maps in accordance with an embodiment of the subject invention. Table 3 shows the time to produce the combination matrix, the time for combination, the time for reconstruction, and the energy for a variety of techniques.

TABLE 2

| | Time to produce the combination matrix | Time for reconstruction | Relative error |
|---|---|---|---|
| 8 Channels | 0 | 30 s | 1.31% |
| SVD with original image | 7.8 s | 11 s | 11.71% |
| PCA with original image | 0.18 s | 11 s | 11.83% |
| SVD with low resolution image | 7.8 s | 11 s | 11.70% |
| PCA with low resolution image | 0.18 s | 11 s | 11.83% |
| SVD with low resolution sensitivity map | 7.8 s | 11 s | 11.07% |
| PCA with low resolution sensitivity map | 0.18 s | 11 s | 10.66% |
| SVD with high resolution sensitivity map | 7.8 s | 11 s | 11.29% |
| PCA with high resolution sensitivity map | 0.18 s | 11 s | 10.46% |

TABLE 3

| | Time to produce the combination matrix | Time for combination | Time for reconstruction | Energy |
|---|---|---|---|---|
| 8 channels | | | 46.4680 | |
| 16 channels | | | | |
| 32 Channels | 0 | | | |
| 12300 center k pts | 0.188 | | | 0.2057/0.2201 |
| Whole center k | 0.734 | 38.22 (32->8) | 47.17 | 0.2058/0.2186 |
| 32 channel no GRAPPA | | | | |
| First 8 combined channel no GRAPPA | | | | 0.1944 |
| First 8 combined channel with GRAPPA (WCB) | | | | 0.2058 |
| Second 8 combined channel with GRAPPA (WCB) | | | | 0.0772 |
| Third 8 combined channel with GRAPPA(WCB) | | | | 0.0497 |
| Last 8 combined channel with GRAPPA(WCB) | | | | 0.0370 |
| First 16 | | | | 0.2208 |

TABLE 3-continued

| | Time to produce the combination matrix | Time for combination | Time for reconstruction | Energy |
|---|---|---|---|---|
| First 24 | | | | 0.2270 |
| All 32 | | | | 0.2304 |
| First 8, u22 ACS lines [143 188] | | | 13.875 | 0.2071 |
| First 8, u22 ACS lines [153 178] | 38.22 | | 11.297 | 0.2097 clean |
| First 16 GRAPPA ACS lines [153 178] | | | 113.7660 | 0.1325 |
| Last 16 GRAPPA ACS lines [153 178] | | | 115.2030 | 0.2107 |
| Combine F16 and L16 GRAPPA ACS lines [153 178] | | | | 0.2488 Noisy |
| First combined 16, u22, direct ACS lines [153 178] | | 79.7190 | 38.03 | 0.2355 |
| First combined 16, normalized noise correlation, u22, direct ACS lines [153 178 | | 79.5470 | 37.8430 | 0.2223 |
| First combined 16, LIKE, direct ACS lines [153 178] | | 80.109 | 95.109 | 0.2231 |
| First combined 16, sliding GRAPPA, direct ACS lines [153 178] | | 79.2650 | 113.0160 | 0.2344 Noisier than LIKE |

EXAMPLE 1

Implementation of Selectable Mode Compression

Figure 4:
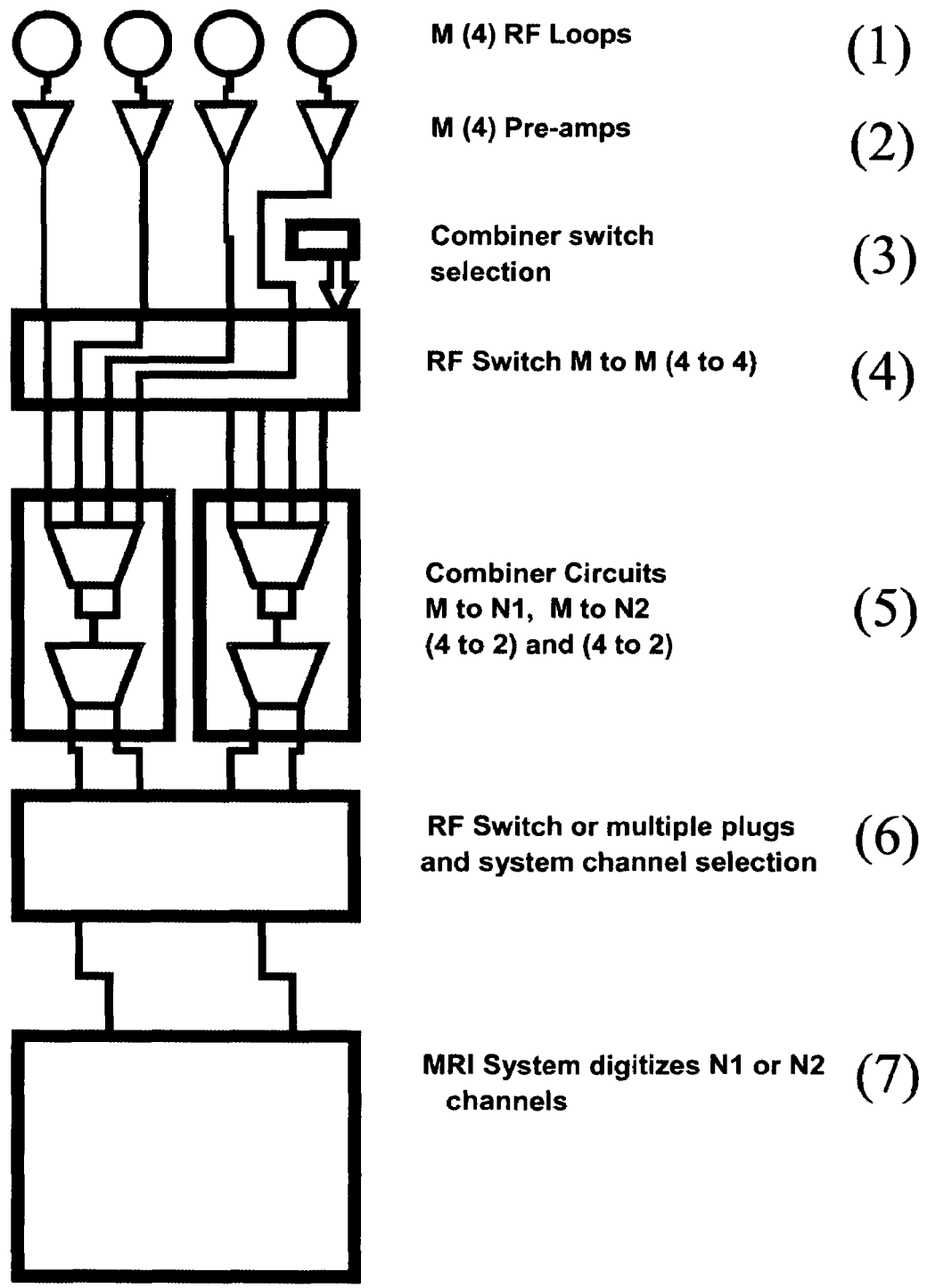
FIG. 4 shows a flow diagram for a hardware implementation of a mode selection technique in accordance with a specific embodiment of the subject invention.

A specific embodiment of the subject invention pertaining to Selectable Mode Compression, as described above, employs a 32 channel coil. In this example, referring to FIG. 4, the subject process is described with respect to an embodiment employing 4 RF elements and producing 4 channel signals such that M=L and a channel signal is produced for each RF element signal.

1. Analog MR signals are acquired from all L RF loop antennae.
2. M signals are pre-amplified.
3. A signal is sent to the RF switch based on the main PE direction of the scan.
4. The RF switch routes all M channel signals to one of the combiner circuits.
5. The selected combiner circuit compresses the M channel signals to N channel signals.
6. The selected channels are routed to the system.
7. The MR system digitizes and reconstructs N channel signals.

EXAMPLE 2

Implementation of Software Computed Sensitivity Based Combination

Figure 5:
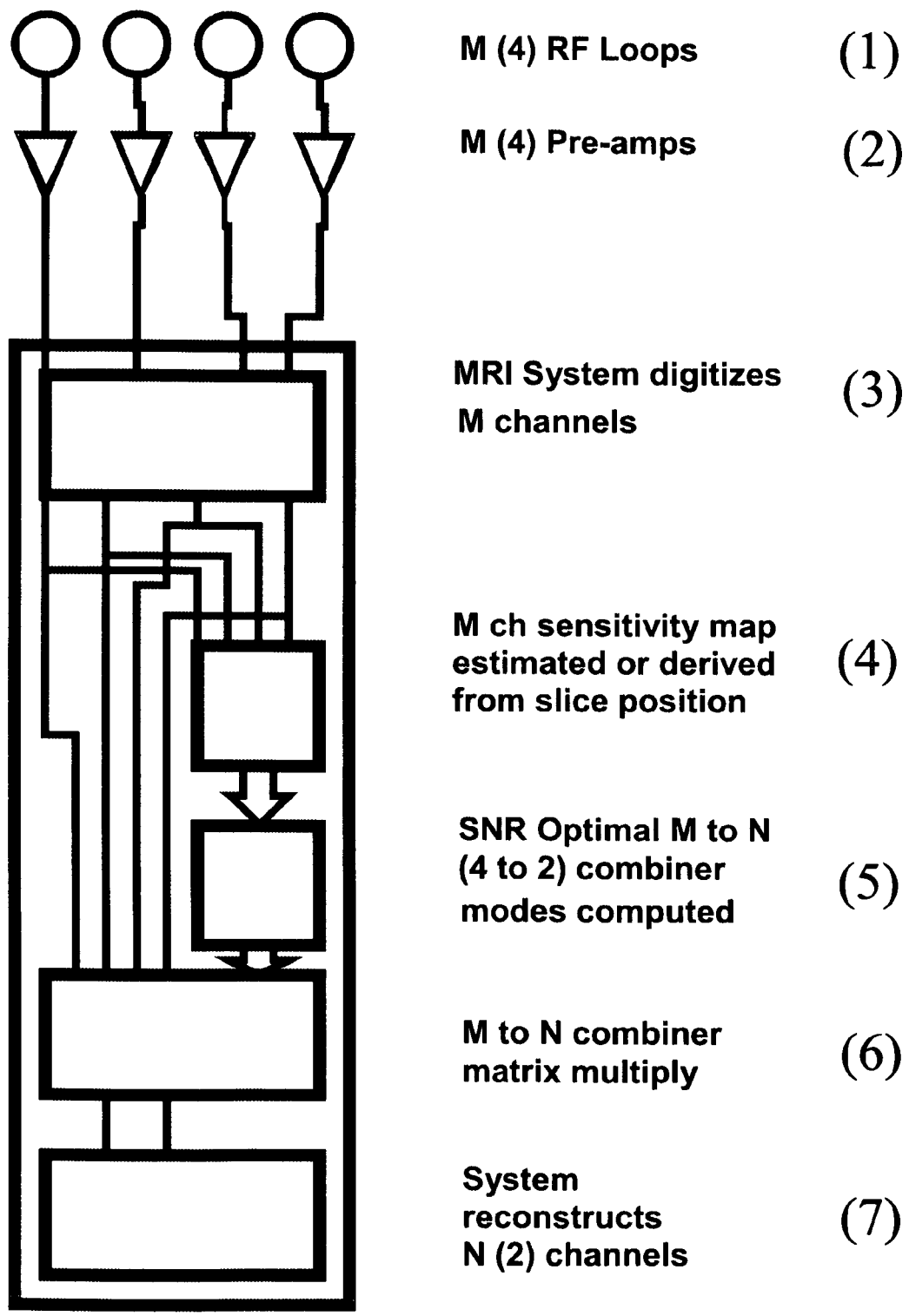
FIG. 5 shows a flow diagram of an adaptive software mode selection technique in accordance with a specific embodiment of the subject invention.

Referring to FIG. 5, a specific embodiment of the subject invention, as taught in this example, can incorporate the following steps, so as to implement an adaptive combiner in software. There are 4 RF elements and 4 channel signals produced from the 4 RF elements such that M=L and a channel signal is produced for each RF channel signal.

1. Acquire L RF signals from the coil and produce M channel signals.
2. Pre-amplify all M signals and output to system channels.
3. Digitize all M signals.
4. Estimate the M channel sensitivity map.
5. Compute an M to N channel combiner matrix, Q, from the low resolution sensitivity map information, wherein N≦M.
6. Apply the combiner to the data readouts to create information from a synthetic N channel coil.
7. Reconstruct N channels with a standard parallel imaging algorithm. If a separate sensitivity map is used, the combiner matrix Q can be applied to the map as well as the readout data.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

The invention claimed is:

1. A method of parallel imaging in a MRI system, comprising:
    receiving M input channel signals, where M is a integer, wherein each of the M channel signals is a complex linear combination of L receiver signals corresponding to L receiver elements, wherein the L receiver elements are L RF coil elements of a magnetic resonance imaging coil configuration, wherein the M input channel signals have sensitivity characteristics, $e_1$ (x, y, z), $e_2$ (x, y, z), . . . , $e_M$(x, y, z), as a function of x, y, and z, over a region of interest;
    defining P mode sets, where P is an integer greater than or equal to 2, wherein the P mode sets have $N_1, N_2, \ldots, N_P$ output channel signals, respectively, where $N_1, N_2, \ldots, N_P$ are integers, wherein each output channel signal of each of the P mode sets is a complex linear combination of one or more of the M input channel signals,
    selecting an $i^{th}$ mode set of P mode sets for production of one or more output channel signals corresponding to the selected mode set, where i is an integer in the range from 1 to P, wherein the one or more output channel signals for each of the P mode sets has a set of corresponding one or more sensitivity profiles distinct from the set of one or more sensitivity profiles of the other of the P mode sets,
    wherein at least two of the P mode sets have different fields of view in the region of interest, wherein selection of one of the P mode sets is based on the sensitivity profiles of the P mode sets over the region of interest,
    wherein each of the M, P, $N_1, N_2$, and $N_P$ integers may be different or may be the same as any of the others, wherein the one or more output channel signals corresponding to the selected mode set are utilizable in producing an MRI image.
2. The method according to claim 1, further comprising:
    conducting a prescan utilizing the L RF coil elements to obtain an approximation of $e_1$ (x, y, z), $e_2$ (x, y, z), . . . , $e_M$ (x, y, z).
3. The method according to claim 1, wherein a complex M×L matrix is used to produce the M channel signals from the L receiver signals.

4. The method according to claim 3, wherein the complex M×L matrix is generated by principle component analysis.

5. The method according to claim 1, wherein each of the P mode sets has a different sensitivity profile than the other of the P mode sets.

6. The method according to claim 1, wherein selecting one of the P mode sets comprises a user selecting one of the P mode sets.

7. The method according to claim 1, wherein selecting one of the P mode sets comprises selecting one of the P mode sets via software.

8. A method according to claim 1, wherein selecting one of the P mode sets comprises selecting one of the P mode sets based on the direction of phase encoding during parallel imaging.

9. A method of parallel imaging in an MRI system, comprising:
   receiving M input channel signals, where M is an integer, wherein each of the M channel signals is a complex linear combination of L receiver signals corresponding to L receiver elements, wherein the L receiver elements are L RF coil elements of a magnetic resonance imaging coil configuration, wherein the M input channel signals have sensitivity characteristics, $e_1(x, y, z)$, $e_2(x, y, z)$, ..., $e_M(x, y, z)$, as a function of x, y, and z, over a region of interest;
   defining P mode sets, where P is an integer greater than or equal to 2, wherein the P mode sets have $N_1, N_2, \ldots, N_P$ output channel signals, respectively, , where $N_1, N_2, \ldots, N_P$ are integers, wherein each output channel signal of each of the P mode sets is a complex linear combination of one or more of the M input channel signals,
   selecting an $i^{th}$ mode set of P mode sets for production of one or more output channel signals corresponding to the selected mode set, where i is an integer in the range from 1 to P, wherein the one or more output channel signals for each of the P mode sets has a set of corresponding one or more sensitivity profiles distinct from the set of one or more sensitivity profiles of the other of the P mode sets,
   wherein at least two of the P mode sets have the substantially same field of view in the region of interest, wherein the at least two of the P mode sets have different sensitivity profiles in the region of interest, wherein selection of one of the P mode sets is based on the sensitivity profiles of the P mode sets in the region of interest,
   wherein each of the M, P, $N_1$, $N_2$, and $N_P$ integers may be different or may be the same as any of the others, wherein the one or more output channel signals corresponding to the selected mode set are utilizable in producing an MRI image.

10. The method according to claim 9, wherein each of the P mode sets has substantially the same field of view in the region of interest.

11. The method according to claim 9, wherein a complex M×L matrix is used to produce the M channel signals from the L receiver signals.

12. The method according to claim 11, wherein the complex M×L matrix is generated by principle component analysis.

13. The method according to claim 9, wherein each of the P mode sets has a different sensitivity profile than the other of the P mode sets.

14. The method according to claim 9, wherein selecting one of the P mode sets comprises a user selecting one of the P mode sets.

15. The method according to claim 10, wherein selecting one of the P mode sets comprises selecting one of the P mode sets via software.

16. A method according to claim 9, wherein selecting one of the P mode sets comprises selecting one of the P mode sets based on the direction of phase encoding during parallel imaging.

17. The method according to claim 9, further comprising:
   conducting a prescan utilizing the L RF coil elements to obtain an approximation of $e_1(x, y, z)$, $e_2(x, y, z)$, ..., $e_M(x, y, z)$.

\* \* \* \* \*

UNITED STATES PATENT AND TRADEMARK OFFICE
CERTIFICATE OF CORRECTION

PATENT NO. : 7,576,536 B2
APPLICATION NO. : 11/430384
DATED : August 18, 2009
INVENTOR(S) : James Hiroshi Akao et al.

It is certified that error appears in the above-identified patent and that said Letters Patent is hereby corrected as shown below:

Patent Reads:
"Notice: Subject to any disclaimer, the term of this patent is extended or adjusted under 35 U.S.C. 154(b) by 0 days.
This patent is subject to a terminal disclaimer.
(21) Appl. No.: 11/430,384"

Should read:
-- Notice: Subject to any disclaimer, the term of this patent is extended or adjusted under 35 U.S.C. 154( b) by 0 days.
(21) Appl. No.: 11/430,384 --

Column 3,
Line 19, "$N_1, N2 \ldots, N_p$" should read -- $N_1, N_2, \ldots, N_p$ --

Column 10,
Line 8, "$N \leqq M$" should read -- $N \leq M$ --.
Line 26, "in a MRI System" should read -- in an MRI system --.

Signed and Sealed this

Twenty-third Day of March, 2010

David J. Kappos
*Director of the United States Patent and Trademark Office*